(12) United States Patent
Chang et al.

(10) Patent No.: US 9,214,551 B2
(45) Date of Patent: Dec. 15, 2015

(54) METHOD FOR FABRICATING SEMICONDUCTOR DEVICE, AND SEMICONDUCTOR DEVICE MADE THEREBY

(71) Applicant: United Microelectronics Corp., Hsinchu (TW)

(72) Inventors: Ming-Hua Chang, Tainan (TW); Tien-Wei Yu, Kaohsiung (TW); I-Cheng Hu, Kaohsiung (TW); Chieh-Lung Wu, Kaohsiung (TW); Yu-Shu Lin, Pingtung County (TW); Chun-Jen Chen, Tainan (TW); Tsung-Mu Yang, Tainan (TW); Tien-Chen Chan, Tainan (TW); Chin-Cheng Chien, Tainan (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 14/183,545

(22) Filed: Feb. 19, 2014

(65) Prior Publication Data
US 2015/0236158 A1    Aug. 20, 2015

(51) Int. Cl.
| | |
|---|---|
| *H01L 29/161* | (2006.01) |
| *H01L 29/165* | (2006.01) |
| *H01L 29/78* | (2006.01) |
| *H01L 29/66* | (2006.01) |
| *H01L 21/02* | (2006.01) |
| *H01L 21/306* | (2006.01) |

(52) U.S. Cl.
CPC ........ *H01L 29/7848* (2013.01); *H01L 21/0245* (2013.01); *H01L 21/0262* (2013.01); *H01L 21/02532* (2013.01); *H01L 21/02579* (2013.01); *H01L 21/02639* (2013.01); *H01L 21/30604* (2013.01); *H01L 29/161* (2013.01); *H01L 29/165* (2013.01); *H01L 29/66477* (2013.01)

(58) Field of Classification Search
CPC . H01L 21/205; H01L 27/088; H01L 29/7848; H01L 29/66; H01L 29/78; H01L 29/161; H01L 29/165; H01L 29/66477; H01L 21/02532; H01L 21/0245; H01L 21/0262; H01L 21/30604
See application file for complete search history.

(56) References Cited

U.S. PATENT DOCUMENTS

| | | | |
|---|---|---|---|
| 6,165,826 A | 12/2000 | Chau et al. | |
| 7,456,087 B2 | 11/2008 | Cheng | |
| 8,482,079 B2 * | 7/2013 | Cheng et al. | 257/369 |
| 8,710,632 B2 * | 4/2014 | Yu et al. | 257/655 |
| 8,796,788 B2 * | 8/2014 | Kwok et al. | 257/408 |

(Continued)

OTHER PUBLICATIONS

Hartmann et al, "Growth kinetics of Si and SiGe on Si(100), Si(110) and Si(111) surfaces," Journal of Crystal Growth, Sep. 4, 2006, pp. 288-295, vol. 294, Issue 2.

*Primary Examiner* — Tan N Tran
*Assistant Examiner* — Fazli Erdem
(74) *Attorney, Agent, or Firm* — J.C. Patents

(57) ABSTRACT

A method for fabricating a semiconductor device, and a semiconductor device made with the method are described. In the method, a cavity is formed in a substrate, a first epitaxy process is performed under a pressure higher than 65 torr to form a buffer layer in the cavity, and a second epitaxy process is performed to form a semiconductor compound layer on the buffer layer in the cavity. In the semiconductor device, the ratio (S/Y) of the thickness S of the buffer layer on a lower sidewall of the cavity to the thickness Y of the buffer layer at the bottom of the cavity ranges from 0.6 to 0.8.

6 Claims, 1 Drawing Sheet

(56) References Cited

U.S. PATENT DOCUMENTS

| | | | |
|---|---|---|---|
| 8,828,833 B1 * | 9/2014 | Blatchford et al. | 438/300 |
| 8,835,982 B2 * | 9/2014 | Kwok et al. | 257/190 |
| 2012/0080721 A1 * | 4/2012 | Liao et al. | H01L 29/165 257/192 |
| 2012/0181625 A1 * | 7/2012 | Kwok et al. | H01L 29/165 257/408 |
| 2012/0205715 A1 * | 8/2012 | Kwok et al. | 257/190 |
| 2012/0319203 A1 * | 12/2012 | Cheng et al. | 257/346 |
| 2013/0026538 A1 * | 1/2013 | Liao et al. | 257/190 |
| 2013/0092954 A1 * | 4/2013 | Yang et al. | 257/77 |
| 2013/0105861 A1 * | 5/2013 | Liao et al. | 257/192 |
| 2013/0126949 A1 * | 5/2013 | Liao et al. | 257/288 |
| 2013/0264613 A1 * | 10/2013 | Liao et al. | 257/288 |
| 2014/0077279 A1 * | 3/2014 | Tu | H01L 21/02532 257/288 |
| 2015/0179795 A1 * | 6/2015 | Kim et al. | H01L 29/66477 257/408 |
| 2015/0179796 A1 * | 6/2015 | Sung et al. | 257/288 |
| 2015/0236157 A1 * | 8/2015 | Kwok et al. | H01L 29/66636 257/192 |

* cited by examiner

METHOD FOR FABRICATING SEMICONDUCTOR DEVICE, AND SEMICONDUCTOR DEVICE MADE THEREBY

BACKGROUND OF THE INVENTION

1. Field of Invention

This invention relates to a semiconductor process and a product thereof, and particularly relates to a method for fabricating a semiconductor device, and to a semiconductor device made by the method.

2. Description of Related Art

In certain types of semiconductor process, a SiGe layer is formed in a cavity in a silicon-substrate to, for example, induce a strain in an adjacent channel of a field-effect device and thereby improve the speed and so on of the device.

For example, as shown in FIG. 1, the field-effect device may be a PMOS device, of which the gate 102 is defined by a hard mask layer 104 on the substrate 100, an S/D extension 106 is formed with the gate 102 as a mask, and a spacer 108 is formed on the sidewall of the gate 102. A SiGe buffer layer 110 having a low Ge content is formed in the substrate 100 beside the gate 102 under a low pressure of about 20 torr, followed by a SiGe layer 112 having a high Ge content for inducing a sufficient strain.

However, the buffer layer 110 formed under low pressure is quite non-conformal, and is quite thin at the lower sidewall. Specifically, the ratio of the thickness of the buffer layer at the lower sidewall to the thickness of the buffer layer at the bottom is about 0.2. Hence, if a dislocation occurs in the SiGe layer 112, the buffer layer 110 at the lower sidewall becomes a weak point through which a Si(111) surface 120 breaks. If the buffer layer 110 at the lower sidewall is formed thicker to avoid such breaking through, the bottom part of the buffer layer 110 becomes overly thick so that the SiGe layer 112 is not deep enough to induce a sufficient strain.

SUMMARY OF THE INVENTION

Accordingly, this invention provides a method for fabricating a semiconductor device, which is capable of preventing the above problems.

This invention also provides a semiconductor device fabricated by the method.

The method for fabricating a semiconductor device of this invention is described below. A cavity is formed in a substrate. A first epitaxy process is performed under a pressure higher than 65 torr to form a buffer layer in the cavity. A second epitaxy process is performed to form a semiconductor compound layer on the buffer layer in the cavity.

In an embodiment of the method, the reaction gas introduced in the first epitaxy process contains a Si-containing gas and a Ge-containing gas, wherein the flow rate ratio of the Si-containing gas to the carrier gas of the first epitaxy process is within the range of 0.01 to 0.03.

In an embodiment, the method further comprising doping the buffer layer and doping the semiconductor compound layer. The resulting semiconductor compound layer and buffer layer may constitute an S/D region of a MOS transistor.

The semiconductor device of this invention includes a substrate having a cavity therein, a buffer layer in the cavity, and a semiconductor compound layer on the buffer layer in the cavity. The ratio (S/Y) of the thickness S of the buffer layer on a lower sidewall of the cavity to the thickness Y of the buffer layer at the bottom of the cavity ranges from 0.6 to 0.8.

Because the conformity of the buffer layer is increased with this invention, the buffer layer is capable to preventing breaking through of a dislocation extending from the semiconductor compound layer, without increasing the thickness of the bottom part of the buffer layer and sacrificing the depth of the semiconductor compound layer.

In order to make the aforementioned and other objects, features and advantages of the present invention comprehensible, a preferred embodiment accompanied with figures is described in detail below.

DESCRIPTION OF EMBODIMENTS

This invention will be further explained with the following embodiments and the accompanying drawings, which are not intended to restrict the scope of this invention. For example, though the buffer layer and the semiconductor compound layer serve as a strain-inducing S/D region of a MOS device in the following embodiments, they may alternatively serve as a composite semiconductor layer for other kinds of device in other embodiments of this invention.

Figure 1:
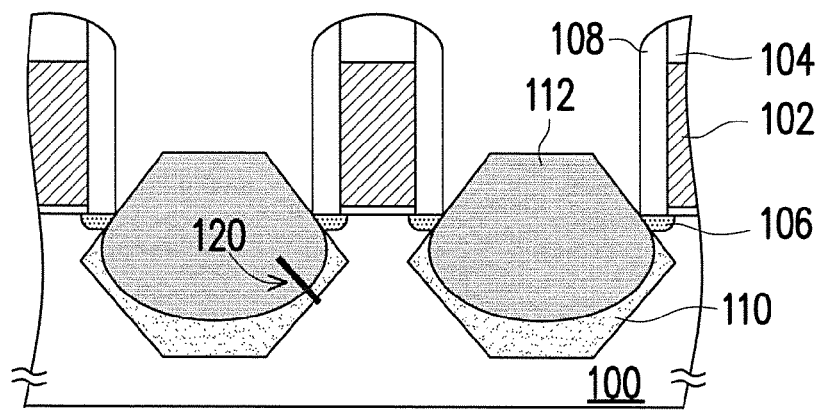
FIG. 1 schematically illustrates, in a cross-sectional view, a structure of a SiGe buffer layer in the prior art and a problem thereof.
Figure 2A:
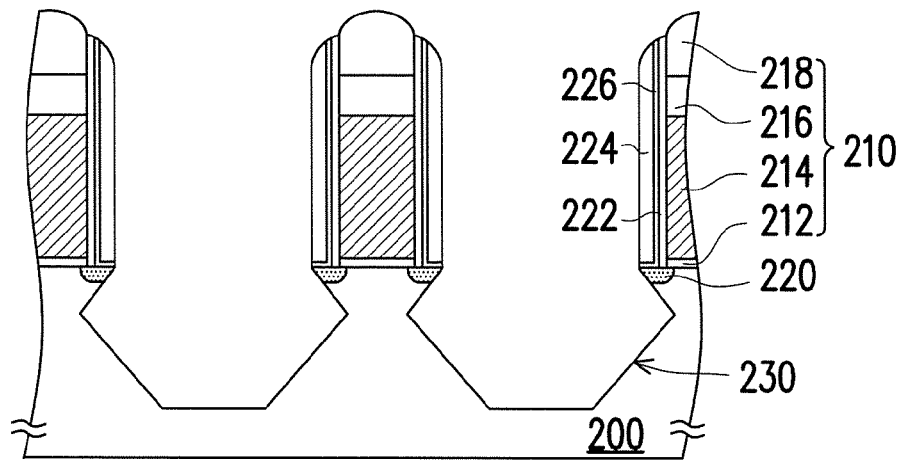
FIGS. 2A and 2B schematically illustrate, in a cross-sectional view, a method for fabricating a semiconductor device according to an embodiment of this invention, wherein FIG. 2B also illustrates the resulting semiconductor device.
Figure 2B:
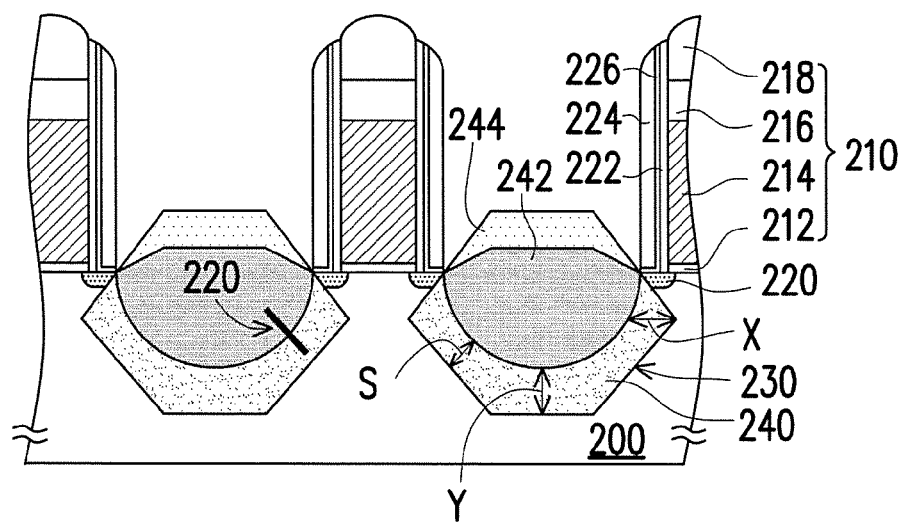

FIGS. 2A and 2B schematically illustrate, in a cross-sectional view, a method for fabricating a semiconductor device according to an embodiment of this invention, wherein FIG. 2B also illustrates the resulting semiconductor device.

Referring to FIG. 2A, a semiconductor substrate 200 is provided, on which gate stacked structures 210 have been formed. Each gate stacked structure 210 may include, from bottom to top, a gate dielectric layer 212, a gate conductor 214, a cap layer 216 and a hard mask layer 218. An S/D extension 220 has been formed in the substrate 200 beside each gate stacked structure 210 using the same as a mask. In addition, a protection layer 222 and a spacer 224 have been formed on the sidewall of each gate stacked structure 210. A liner layer 226 may be formed on the sidewall of each gate stacked structure 210 before the spacer 224 is formed. The substrate 200 may be a single-crystal Si-substrate or an epitaxial Si-substrate. The protection layer 222 may include SiCN. The hard mask layer 218 and the spacer 224 may include silicon nitride (SiN).

Thereafter, a plurality of cavities 230 is formed in the substrate 200 with the gate stacked structures 210 and the sidewall layers 222 to 226 as a mask. The depth of the cavities 230 ranges from 200 Å to 900 Å, allowing a sufficient strain to be induced in the substrate 200. Each cavity 230 may have a diamond shape, which may be formed by anisotropic etching and subsequent lateral etching. The diamond shape means that the cavity 230 has a lower sidewall and an upper sidewall with a turning region between them, as shown in the figure. The diamond shape allows the strain inducing effect of the semiconductor compound layer formed later to be increased.

Referring to FIG. 2B, a first selective epitaxial growth (SEG) process is performed, under a pressure higher than 65 torr, to form a buffer layer 240. The upper limit of the pressure of the first SEG process may be 120 torr. The buffer layer 240 serves a part of an S/D region of a MOS device in this embodiment, and has to be doped with, for example, boron.

The doping method is preferably in-situ doping, in which a dopant is added in the formation process of the buffer layer 240.

With the relatively higher pressure (>>20 torr of the prior art), the ratio (S/Y) of the thickness S of the buffer layer 240 on the lower sidewall of the cavity 230 to the thickness Y of the buffer layer 240 at the bottom of the cavity 230 ranges from 0.6 to 0.8. The ratio (X/Y) of the thickness X of the buffer layer 240 at the turning region between the lower sidewall and the upper sidewall of the cavity 230 to the thickness Y of the buffer layer 240 at the bottom of the cavity 230 ranges from 1.1 to 1.5.

The buffer layer 240 may include SiGe or SiP. When the buffer layer 240 includes SiGe, it usually has a germanium content less than 30 wt %, and the reaction gas of the first SEG process may contain a Si-containing gas and a Ge-containing gas. The Si-containing gas may be dichlorosilane (DCS) or silane. The Ge-containing gas may be $GeH_4$. In addition, a carrier gas is usually introduced in SEG. The carrier gas may be $H_2$. The flow rate ratio of the Si-containing gas to the carrier gas is preferably in the range of 0.01 to 0.03. The flow rate ratio of the Ge-containing gas to the carrier gas is preferably in the range of 0.0000001 to 0.1.

An etching gas may also be introduced in the first SEG process to increase the selectivity of SEG, wherein the flow rate ratio of the etching gas to the reaction gas may range from 0.12 to 0.25. The etching gas may include HCl, HBr or HF.

In addition, if the buffer layer 240 requires in-situ doping, a dopant-containing gas is also introduced in the first SEG process. The dopant-containing gas may be diborane ($B_2H_6$).

The temperature of the first SEG process may be within the range of 600° C. to 800° C., preferably at about 700° C.

The formation parameters and structure of the SiGe buffer layer according to this embodiment and those of the SiGe buffer layer in the prior art are compared in Table 1, wherein the term "E/D ratio" means the ratio of the etching gas to the reaction gas.

TABLE 1

|  | Prior art | This embodiment |
|---|---|---|
| Ge content | 5-30% | 5-30% |
| Pressure | 20 torr | >65 torr (65-120 torr) |
| DCS (relative to $H_2$) | <1% | >1% (1-3%) |
| E/D ratio [HCl/(DCS + Ge)] | 0.09 | 0.12-0.25 |
| X/Y | 0.6-0.7 | >1 (1.1-1.5) |
| S/Y | 0.2 | 0.6-0.8 |

Referring to FIG. 2B again, a second SEG process is performed, preferably directly after the first SEG process by adjusting some of the deposition parameters, to form a semiconductor compound layer 242 on the buffer layer 240 in the cavity 230. When the buffer layer 240 includes SiGe having a Ge content less than 30 wt %, the semiconductor compound layer 242 may include SiGe having a Ge content in the range of 10 to 30 wt %. The higher Ge content may be achieved by increasing the ratio of the Ge-containing gas to the Si-containing gas.

The pressure in the second SEG process may be lower than that in the first SEG process, possibly in the range of 70 to 110 torr. Because the semiconductor compound layer 242 serves another part of the S/D region of a MOS device in this embodiment, it also has to be doped like the buffer layer 240 does. The dopant concentration of the semiconductor compound layer 242 may be higher than that of the buffer layer 240. For example, the dopant concentration of the semiconductor compound layer 242 is within the range of $1\times10^{18}$ to $5\times10^{20}/cm^3$, and that of the buffer layer 240 is within the range of $1\times10^{18}$ to $4\times10^{20}/cm^3$.

In the above embodiment, because the conformity of the SiGe buffer layer is increased (S/Y=0.6-0.8), the SiGe buffer layer is capable of avoiding breaking through of a Si(111) surface due to a dislocation extending from the strain-inducing SiGe layer, without increasing the thickness of the bottom part of the SiGe buffer layer and sacrificing the depth of the strain-inducing SiGe layer.

Referring to FIG. 2B again, thereafter, a silicon layer 244 may be deposited on the semiconductor compound layer 242 by a third SEG process using no Ge-containing. The silicon layer 244 is for reacting with a metal layer in a later self-aligned silicide (salicide) process (not shown) to form a silicide layer.

EXAMPLES

This invention will be further described with some examples, which are not intended to restrict the scope of this invention.

In each of the following Comparative Example 1 and Examples 1 to 9, the SEG process for forming the SiGe buffer layer was conducted at 700° C., the introduced gases included DCS, $GeH_4$, $H_2$ and HCl, and the depth, the middle width (at the level of X) and the bottom width of the cavity in which the SiGe buffer layer was deposited were 600 Å, 1000 Å and 500 Å, respectively. The varying parameters and the results of X, S and so on are listed in Table 2.

TABLE 2

|  | DCS (sscm) | $GeH_4$ (sscm) | HCl (sscm) | $H_2$ (sscm) | DCS/$H_2$ | E/D | $GeH_4$/DCS | Pressure (torr) | X (Å) | S (Å) | Y (Å) | X/Y | S/Y |
|---|---|---|---|---|---|---|---|---|---|---|---|---|---|
| CEx.1 | 66 | 280 | 68 | 29000 | 0.0023 | 0.21 | 2.12 | 10 | 80 | 39 | 134 | 0.59 | 0.29 |
| Ex. 1 | 450 | 200 | 90 | 6100 | 0.074 | 0.14 | 0.44 | 100 | 82 | 50 | 72 | 1.14 | 0.69 |
| Ex. 2 | 225 | 100 | 45 | 13000 | 0.017 | 0.14 | 0.44 | 100 | 101 | 48 | 73 | 1.38 | 0.66 |
| Ex. 3 | 260 | 100 | 45 | 13000 | 0.02 | 0.13 | 0.38 | 100 | 106 | 59 | 73 | 1.45 | 0.81 |
| Ex. 4 | 225 | 100 | 30 | 13000 | 0.017 | 0.09 | 0.44 | 100 | 78 | 42 | 67 | 1.16 | 0.63 |
| Ex. 5 | 225 | 100 | 45 | 8000 | 0.028 | 0.14 | 0.44 | 100 | 87 | 40 | 60 | 1.45 | 0.67 |
| Ex. 6 | 225 | 85.5 | 45 | 13000 | 0.017 | 0.15 | 0.38 | 100 | 85 | 39 | 64 | 1.33 | 0.61 |
| Ex. 7 | 225 | 70 | 45 | 13000 | 0.017 | 0.15 | 0.31 | 100 | 86 | 44 | 66 | 1.3 | 0.67 |
| Ex. 8 | 225 | 55 | 45 | 13000 | 0.017 | 0.16 | 0.24 | 100 | 82 | 43 | 60 | 1.36 | 0.72 |
| Ex. 9 | 225 | 70 | 60 | 13000 | 0.017 | 0.20 | 0.31 | 100 | 90 | 42 | 60 | 1.5 | 0.7 |

CEx.: Comparative Example (CEx. 1 As the Base Line); Ex.: Example

It is clear from Table 2 that when the pressure of the SEG process for forming the SiGe buffer layer was set to be higher than 65 torr, the SiGe buffer layer could have a high conformity that is much higher than that (about 0.2) in the prior art to effectively avoid breaking through of a Si(111) surface due to a dislocation extending from the strain-inducing SiGe layer.

Moreover, by comparing Example 1 with Examples 3 and 8, it is known that setting the flow rate ratio of DCS as the Si-containing gas to $H_2$ as the carrier gas to be within the range of 0.01 to 0.03 also helped to increase the conformity. By comparing Example 4 with Examples 2, 3 and 5, it is known that setting the flow rate ratio of HCl as the etching gas to DCS+$GeH_4$ as the reaction gas to be within the range of 0.12 to 0.25 also helped to increase the conformity.

This invention has been disclosed above in the preferred embodiments, but is not limited to those. It is known to persons skilled in the art that some modifications and innovations may be made without departing from the spirit and scope of this invention. Hence, the scope of this invention should be defined by the following claims.

What is claimed is:

1. A semiconductor device, comprising:
 a substrate having a cavity therein, wherein the cavity has a diamond shape, in which the diamond shaped cavity has a lower sidewall, an upper sidewall, and a turning region that is present between the lower sidewall and the upper sidewall;
 a buffer layer in the cavity; and
 a semiconductor compound layer on the buffer layer in the cavity,
 wherein a ratio (S/Y) of a thickness S of the buffer layer on the lower sidewall of the cavity to a thickness Y of the buffer layer at a bottom of the cavity ranges from 0.6 to 0.8,
 wherein a ratio (X/Y) of a thickness X of the buffer layer at the turning region to the thickness Y of the buffer layer at the bottom of the cavity ranges from 1.1 to 1.5.

2. The semiconductor device of claim 1, wherein the buffer layer comprises SiGe having a germanium content less than 30 wt %.

3. The semiconductor device of claim 2, wherein the semiconductor compound layer comprises SiGe having a germanium content in a range 10 to 30 wt %.

4. The semiconductor device of claim 3, further comprising a silicon layer on the semiconductor compound layer.

5. The semiconductor device of claim 1, wherein the semiconductor compound layer and the buffer layer are doped, and a dopant concentration of the semiconductor compound layer is higher than a dopant concentration of the buffer layer.

6. The semiconductor device of claim 5, wherein the semiconductor compound layer and the buffer layer constitute a source/drain region of a MOS transistor.

\* \* \* \* \*